United States Patent
Yano et al.

(10) Patent No.: US 7,915,062 B2
(45) Date of Patent: Mar. 29, 2011

(54) METHOD OF MANUFACTURING A TFT ARRAY SUBSTRATE

(75) Inventors: Shinichi Yano, Kumamoto (JP); Tadaki Nakahori, Kumamoto (JP); Nobuaki Ishiga, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 523 days.

(21) Appl. No.: 11/762,398

(22) Filed: Jun. 13, 2007

(65) Prior Publication Data

US 2007/0295963 A1  Dec. 27, 2007

(30) Foreign Application Priority Data

Jun. 22, 2006 (JP) ................. 2006-172860

(51) Int. Cl.
*H01L 21/00* (2006.01)
*H01L 21/22* (2006.01)

(52) U.S. Cl. .......... 438/30; 438/544; 438/155; 438/608; 438/729

(58) Field of Classification Search .............. 438/30, 438/544, 158, 609, 151, 720
See application file for complete search history.

(56) References Cited

U.S. PATENT DOCUMENTS

| | | | |
|---|---|---|---|
| 5,726,077 A * | 3/1998 | Kawahata et al. | 438/30 |
| 6,350,995 B1 | 2/2002 | Sung et al. | |
| 6,433,842 B1 | 8/2002 | Kaneko et al. | |
| 6,435,842 B2 * | 8/2002 | Song | 417/363 |
| 6,653,216 B1 * | 11/2003 | Shimomaki et al. | 438/608 |
| 6,806,933 B2 * | 10/2004 | Ko | 349/139 |
| 2004/0126608 A1 | 7/2004 | Gotoh et al. | |
| 2005/0024549 A1 | 2/2005 | Gotoh et al. | |

FOREIGN PATENT DOCUMENTS

| | | |
|---|---|---|
| JP | 59-193062 | 11/1984 |
| JP | 8-50308 | 2/1996 |
| JP | 11-352503 | 12/1999 |
| JP | 2000-199912 | 7/2000 |
| JP | 2000-284326 | 10/2000 |
| JP | 2001-68679 | 3/2001 |
| JP | 2005-62802 | 3/2005 |
| KR | 10-2004-0080531 | 9/2004 |
| KR | 10-2006-0040861 | 5/2006 |

* cited by examiner

*Primary Examiner* — Howard Weiss
*Assistant Examiner* — Steven H Rao
(74) *Attorney, Agent, or Firm* — Oblon, Spivak, McClelland, Maier & Neustadt, L.L.P.

(57) ABSTRACT

A TFT array substrate includes a TFT having an ohmic contact film and a source electrode and a drain electrode formed on the ohmic contact film. It also includes a pixel electrode electrically connected with the drain electrode. The source electrode and the drain electrode are made of an Al alloy containing Ni as an additive.

17 Claims, 4 Drawing Sheets

METHOD OF MANUFACTURING A TFT ARRAY SUBSTRATE

BACKGROUND OF THE INVENTION

1. Field of the Invention

The present invention relates to a TFT array substrate and a method of manufacturing the same.

2. Description of Related Art

An electro-optic device such as a liquid crystal display attracts attention as one of flat panel displays to replace CRT. It has the features of low power consumption and thin profile and is widely applied to products having such features. An active matrix liquid crystal display often uses a TFT as a switching device.

In order to improve the productivity of such a liquid crystal display, it is necessary to reduce the number of manufacturing steps of a TFT array substrate having TFTs. For example, a manufacturing method that reduces the number of photolithography steps is disclosed in Japanese Unexamined Patent Application Publication No. 8-50308 (paragraphs 0084-0089, FIGS. 54 to 63). This technique allows the production of a TFT array substrate in five photolithography steps.

According to Japanese Unexamined Patent Application Publication No. 8-50308, the method first forms a source-drain electrode (SD) and a channel portion of a TFT as shown in FIGS. 58 and 59. This process first deposits a metal thin film such as Ti. Then, it patterns a resist by photolithography and performs wet etching using drug solution such as hydrofluoric acid and nitric acid. Then, the process etches a Ti film and an ohmic contact ($n^+$a-Si) film in a semiconductor layer below the Ti film to thereby form the SD and the channel portion. The method then deposits a passivation film by plasma CVD or the like as shown in FIGS. 60 to 63. Then, it creates a contact hole to the drain electrode. After that, the method forms a transparent pixel electrode made of ITO, which is electrically connected with the drain electrode through the contact hole.

The inventors of the present invention have now discovered that annealing at about 300° C. is required in the structure where an ITO is electrically connected with a metal such as Ti, Cr and Ta in order to reduce the contact resistance at the interface. However, this causes a decrease in the mobility of TFT. Further, the high line resistance hinders the achievement of a large-size TFT-LCD, high-definition and high-speed response.

One approach to this problem is to use Al for the SD to reduce the line resistance. In this structure, however, it is impossible to establish a direct contact between Al and $n^+$a-Si and a direct contact between Al and an ITO. Thus, a direct contact between the SD and an ohmic contact film and a direct contact between the SD and a transparent pixel electrode cannot be established in this structure. To address this problem, Japanese Unexamined Patent Application Publication No. 2000-199912 discloses a method that configures the SD as a three-layer structure of MoCr/Al arroy/MoCr to reduce line resistance and establish a direct contact between the SD and an $n^+$a-Si film in a lower layer and a direct contact between the SD and an ITO in a upper layer. In this method, however, it is necessary to deposit three layers for the SD, which complicates the production process.

SUMMARY OF THE INVENTION

The present invention has been accomplished to solve the above problems and an object of the present invention is thus to provide a TFT array substrate having good contact characteristics at the interface of electrodes and a method of manufacturing the TFT array substrate.

According to one aspect of the present invention, there is provided a TFT array substrate including a thin film transistor (TFT) including an ohmic contact film and an electrode in contact with the ohmic contact film, the electrode is made of an Al alloy containing Ni as an additive, and a light transmissive conductive film electrically connected with the electrode.

According to another aspect of the present invention, there is provided a method of manufacturing a TFT array substrate including a thin film transistor (TFT) having an ohmic contact film and an electrode in contact with the ohmic contact film. The method includes forming the TFT, depositing an interlayer insulating film to cover the TFT at a temperature of 280° C. or lower, creating a contact hole penetrating through the interlayer insulating film to reach a surface of the electrode, and forming a light transmissive conductive film electrically connected with the electrode through the contact hole.

The present invention provides a TFT array substrate having good contact characteristics at the electrodes interface and a method of manufacturing the TFT array substrate.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
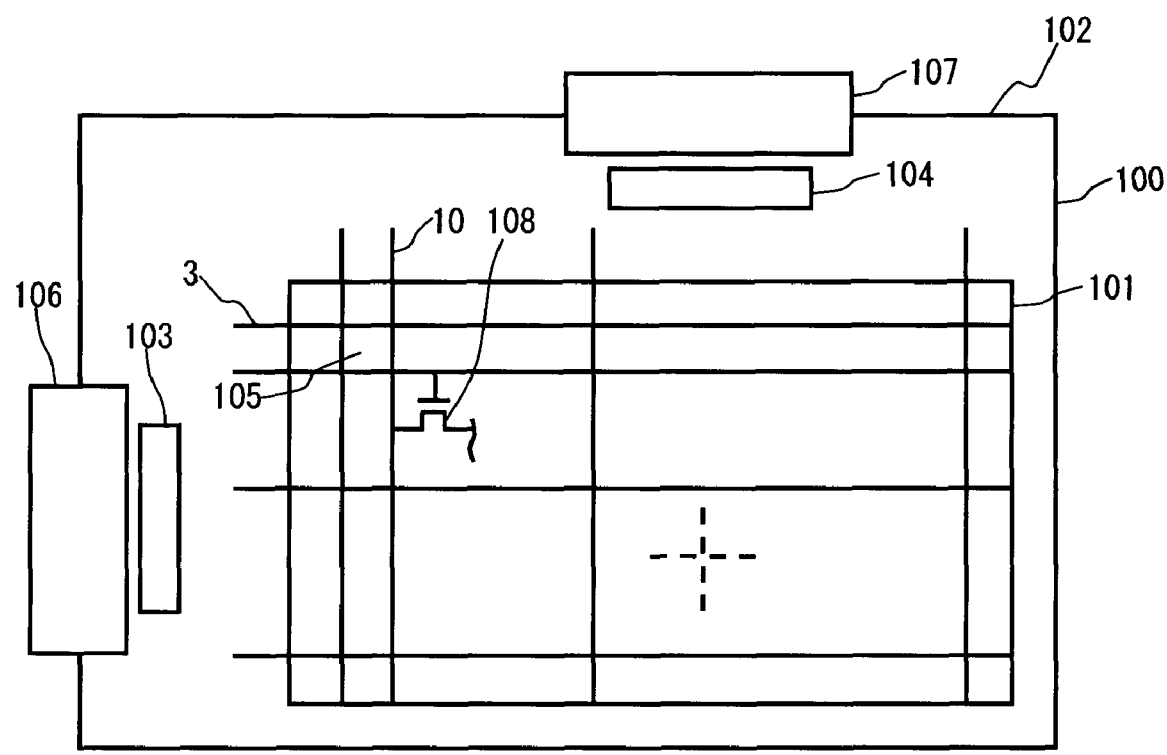
FIG. 1 is a top plan view showing a TFT array substrate according to the present invention.

Prior to the description of several embodiments of the present invention, the structure of a TFT array substrate is described with reference to the drawings. FIG. 1 is a top plan view showing the structure of a TFT array substrate according to the present invention. The TFT array substrate of the present invention may be used for flat panel displays such as liquid crystal displays and organic EL displays.

A substrate 100 is a thin film transistor (TFT) array substrate according to the present invention. The substrate 100 includes a display area 101 and a frame area 102 surrounding the display area 101. In the display area 101, a plurality of gate lines (scanning signal lines) 3 and a plurality of source lines (display signal lines) 10 are formed. The plurality of gate lines 3 are arranged in parallel. The plurality of source lines 10 are also arranged in parallel. The gate line 3 and the source line 10 cross each other in orthogonal relation. An area surrounded by the gate line 3 and the source line 10 adjacent to each other corresponds to a pixel 105. Thus, the pixels 105 are arranged in matrix in the substrate 100.

Further, in the frame area 102 of the substrate 100, a scanning signal driver 103 and a display signal driver 104 are formed. The gate line 3 extends from the display area 101 to the frame area 102. The gate line 3 is connected to the scanning signal driver 103 at the end of the substrate 100. The source line 10 also extends from the display area 101 to the frame area 102. The source line 10 is connected to the display signal driver 104 at the end of the substrate 100. An external line 106 is connected in close proximity to the scanning signal driver 103. An external line 107 is connected in close proximity to the display signal driver 104. The external lines 106 and 107 may be a wiring board such as FPC (Flexible Printed Circuit).

Various signals are externally supplied through the external lines 106 and 107 to the scanning signal driver 103 and the display signal driver 104, respectively. In accordance with an external control signal, the scanning signal driver 103 supplies a gate signal (scanning signal) to the gate line 3. In response to the gate signal, the gate lines 3 are selected one by one. The display signal driver 104 supplies a display signal to the source line 10 based on an external control signal or display data. A display voltage corresponding to the display data is thereby applied to each pixel 105. Incidentally, the scanning signal driver 103 and the display signal driver 104 are not necessarily formed on the substrate 100. For example, a driver may be connected by use of TCP (Tape Carrier Package).

At least one TFT 108 is formed in each pixel 105. The TFT 108 is placed in close proximity to a crossing point of the source line 10 and the gate line 3. For example, the TFT 108 supplies a display voltage to a pixel electrode. The gate electrode of the TFT 108, which is a switching device, is connected to the gate line 3, so that the TFT 108 is turned ON or OFF in response to a signal input through a gate terminal. The source electrode of the TFT 108 is connected to the source line 10. If a voltage is applied to the gate electrode, current flows from the source line 10. A display voltage is thereby applied to the pixel electrode which is connected to the drain electrode of the TFT 108 through the source line 10. The TFT array substrate has the above-described structure.

In a liquid crystal display, a counter substrate, which is a second substrate, is placed opposite to the TFT array substrate. The TFT array substrate and the counter substrate are adhered with each other by sealing material, and a liquid crystal layer is interposed therebetween. The counter substrate includes a transparent insulating substrate, a color filter layer, and a counterelectrode. The color filter layer includes a black matrix (BM) and a color layer of red (R), green (G) and blue (B), for example. The color filter layer is placed on the lower surface of the transparent insulating substrate, which is made of glass or the like, in the area which faces the pixel area and the TFT 108 to provide color display. The counter electrode is placed in the counter substrate on the liquid crystal layer side to provide a common voltage to supply a signal voltage to the liquid crystal layer.

If a display voltage is applied to a pixel electrode, an electric field corresponding to the display voltage is generated between the pixel electrode and the counter electrode. The liquid crystals are driven by the electric field occurring between the substrates. Specifically, the orientation of the liquid crystals between the substrates changes, so that the polarization of light passing through the liquid crystal layer changes accordingly. A voltage (drive voltage) which is actually applied to the liquid crystals can be changed by controlling a display voltage applied to the source electrode. Because the voltage applied to the liquid crystals can be changed by the source electrode, it is possible to set intermediate transmittance of liquid crystals as appropriate.

A liquid crystal alignment layer for aligning the liquid crystals is coated on the surfaces of the TFT array substrate and the counter substrate. A liquid crystal display, which is an example of the embodiment of the present invention, has the above-described structure.

First Embodiment

Figure 2:
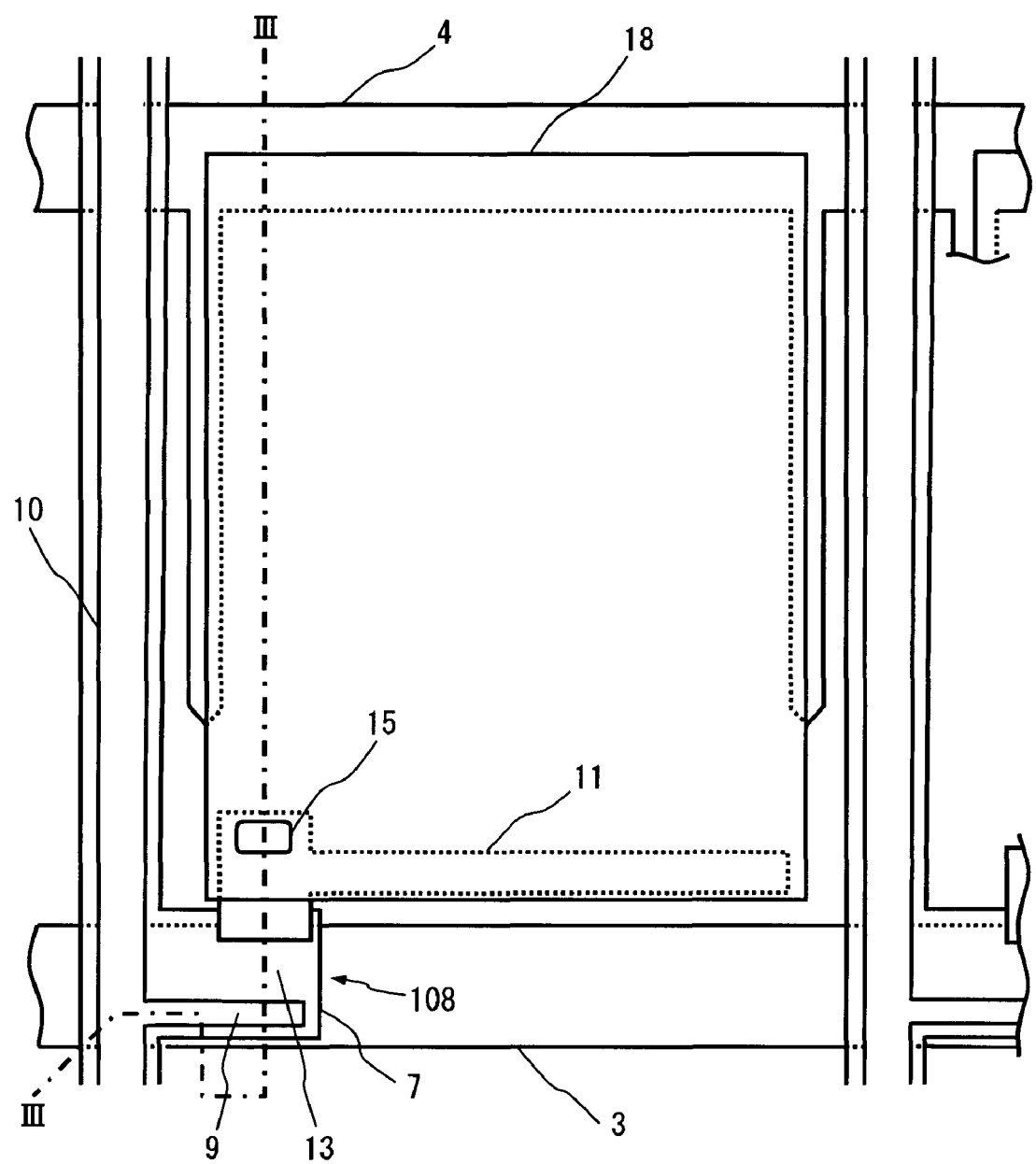
FIG. 2 is a top plan view showing the structure of a pixel of a TFT array substrate according to a first embodiment of the present invention.
Figure 3:
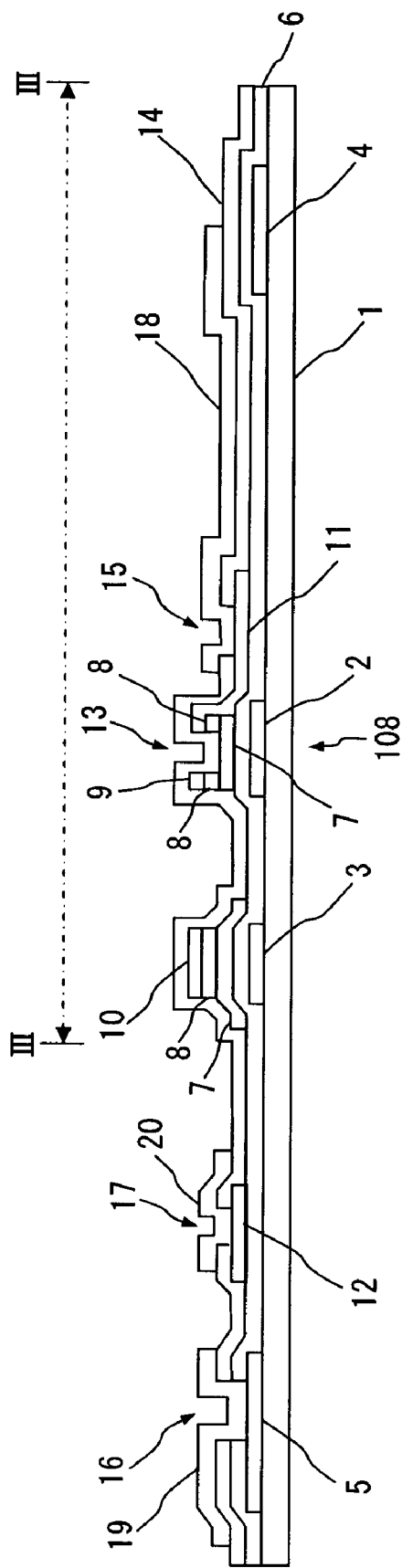
FIG. 3 is a sectional view showing the TFT array substrate according to the first embodiment of the present invention.

The structure and manufacturing method of a TFT array substrate according to a first embodiment of the present invention are described hereinafter with reference to the drawings. FIG. 2 is a top plan view showing the structure of a pixel of a TFT array substrate according to this embodiment, and FIG. 3 is a cross-sectional view along line III-III in FIG. 2. FIG. 3 further shows a gate terminal portion and a source terminal portion on the left part thereof. The TFT array substrate of this embodiment is used for electro-optic displays, and a liquid crystal display is described hereinbelow as an example.

A gate electrode 2, a gate line 3, an auxiliary capacitor electrode 4, and a gate terminal 5 are formed on a transparent insulating substrate 1, which is made of glass or the like. The gate line 3 includes the gate electrode 2, and the gate terminal 5 exists at an end of the gate line 3. The gate electrode 2 constitutes a TFT 108, which serves as a switching device. The auxiliary capacitor electrode 4 is placed between adjacent gate lines 3. A part of the auxiliary capacitor electrode 4 extends along a source line 10. The auxiliary capacitor electrode 4 constitutes an auxiliary capacitor for holding a voltage applied to a pixel electrode 18 for a given length of time.

Further, a scanning signal driver 103, which is supplied with various external signals, is placed on the TFT array substrate. A pad on the scanning signal driver 103 and the gate terminal 5 are electrically connected with each other. A scanning signal from the scanning signal driver 103 is thereby input to the gate line 3 through the gate terminal 5. The gate line 3 then sends the scanning signal to the gate electrode 2. The gate electrode 2 and the gate line 3 are made of an AlNi alloy.

Furthermore, a gate insulating film 6, which is made of a transparent inorganic insulating material, is formed to cover the gate electrode 2, the gate line 3, the auxiliary capacitor electrode 4, and the gate terminal 5. A semiconductor film 7, which constitutes the TFT 108, is formed above the gate line 3 and the gate electrode 2 with the gate insulating film 6 interposed therebetween. An ohmic contact film 8 is formed on the semiconductor film 7. The semiconductor film 7 is patterned to be larger than the source line 10 and a source electrode 9, which are formed thereabove later. The ohmic contact film 8 is removed partly above the gate electrode 2. Thus, the ohmic contact film 8 is placed at both ends of the semiconductor film 7, which constitutes the TFT 108.

The source electrode 9 extends from the source line 10 and constitutes the TFT 108. The source electrode 9 is placed on the ohmic contact film 8 on the side farther from the auxiliary capacitor electrode 4. A source terminal 12 is placed at an end of the source line 10. Further, a display signal driver 104, which is supplied with various external signals, is placed on the TFT array substrate. A pad on the display signal driver 104 and a source terminal 12 are electrically connected with each other. A display signal from the display signal driver 104 is thereby input to the source line 10 through the source terminal 12. The source line 10 then sends the display signal to the source electrode 9. The source electrode 9 and the source line 10 are made of an AlNi alloy.

A drain electrode 11 is formed on the ohmic contact film 8 on the side closer to the auxiliary capacitor electrode 4. The drain electrode 11 also constitutes the TFT 108. The source electrode 9 and the drain electrode 11 are directly in contact with the ohmic contact film 8. A channel portion 13 of the TFT 108 is the semiconductor layer 7 in the area which is in between the source electrode 9 and the drain electrode 11 above the semiconductor layer 7, from which the ohmic contact film 8 is removed. A passivation film 14, which is an interlayer insulating film, is made of a transparent inorganic insulating material and formed to cover the TFT 108. Thus, the passivation film 14 is placed on the source electrode 9 and the drain electrode 11.

A pixel contact hole 15 is created above the drain electrode 11 by penetrating the passivation film 14. Further, a gate terminal contact hole 16 is created above the gate terminal 5 by penetrating the gate insulating film 6 and the passivation film 14. A source terminal contact hole 17 is created above the source terminal 12 by penetrating the passivation film 14.

The pixel electrode 18 is in electrical contact with the drain electrode 11 placed therebelow through the pixel contact hole 15. The pixel electrode 18 is formed between adjacent gate lines 3 except for the TFT portion so as to overlap with at least part of the drain electrode 11 and the auxiliary capacitor electrode 4. The pixel electrode 18 thus overlaps with the auxiliary capacitor electrode 4 in a lower layer with the gate insulating film 6 and the passivation film 14 interposed therebetween. Charges are thereby stored between the auxiliary capacitor electrode 4 and the pixel electrode 18. The auxiliary capacitor electrode 4 constitutes an auxiliary capacitor for holding a voltage applied to the pixel electrode 18 for a given length of time. The pixel electrode 18 is made of a transparent conductive film, which is a light transmissive conductive film, and applies a signal voltage to a liquid crystal layer.

A gate terminal pad 19 is also made of a transparent conductive film and is connected with the gate terminal 5 placed therebelow through the gate terminal contact hole 16. A source terminal pad 20 is also made of a transparent conductive film and is connected with the source terminal 12 placed therebelow through the source terminal contact hole 17. The TFT array substrate is configured as above.

Figure 4:
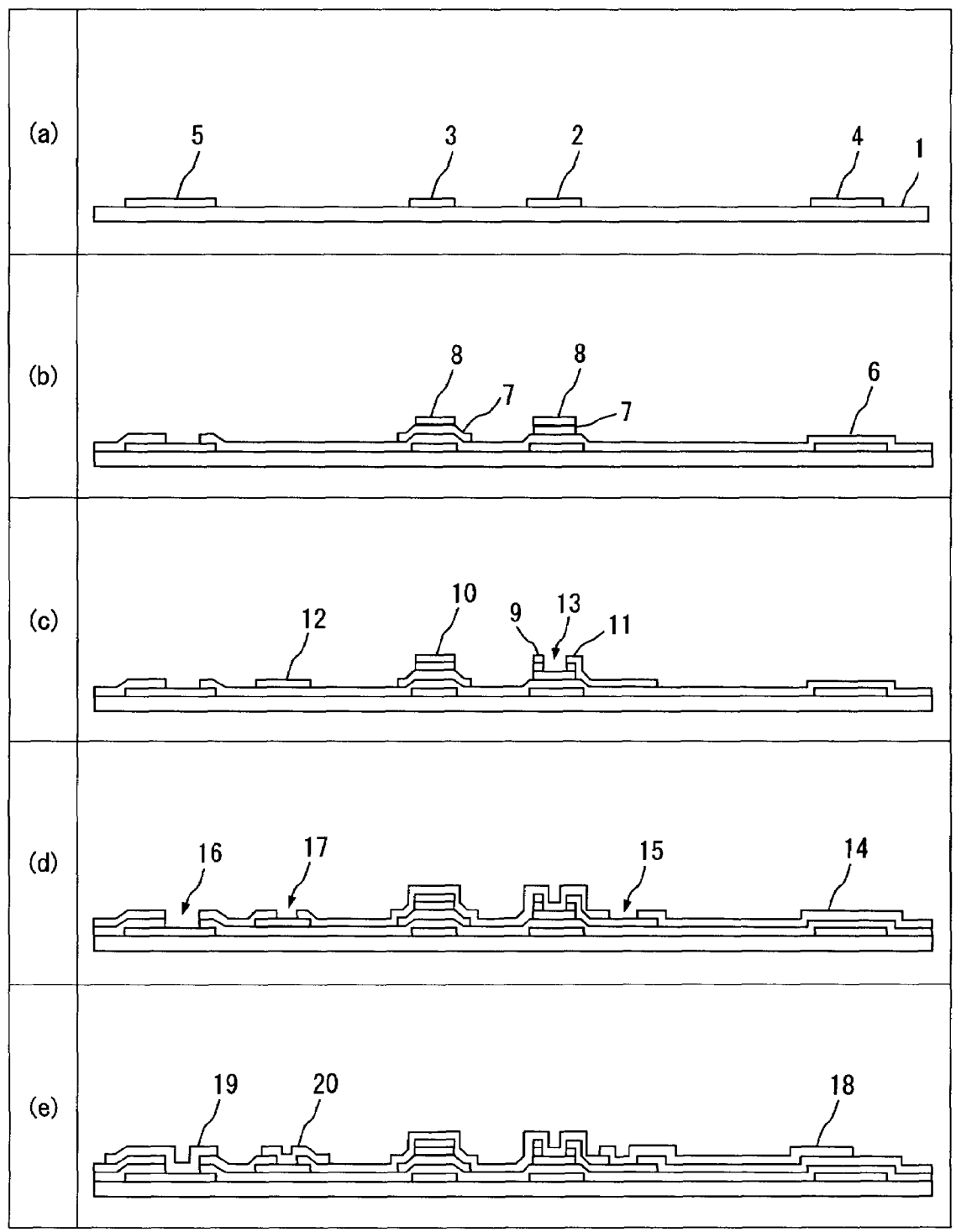
FIG. 4 is a sectional view showing a manufacturing process of a TFT array substrate.

A method of manufacturing the TFT array substrate of the liquid crystal display according to this embodiment is described hereinafter in detail with reference to FIG. 4. FIG. 4 is a cross-sectional view showing the manufacturing method of the TFT array substrate according to this embodiment.

First, the gate electrode 2, the gate line 3, the auxiliary capacitor electrode 4, and the gate terminal 5 are formed. Specifically, a transparent insulating substrate 1, such as a glass substrate, is cleaned using pure water or hot sulfuric acid. Then, a first metal thin film is deposited on the transparent insulating substrate 1 by sputtering or the like. After that, a first photolithography process is performed by coating a photoresist, which is a photosensitive resin, on the first metal thin film by spin coating and exposing and developing the coated photoresist. The photoresist is thereby patterned into a desired shape. Further, the first metal thin film is etched through the photoresist pattern, thereby removing the photoresist pattern. The gate electrode 2, the gate line 3, the auxiliary capacitor electrode 4, and the gate terminal 5 are thereby formed. The first metal thin film is preferably a metal thin film having low electric specific resistance and good electric contact characteristics with the gate terminal pad 19, which is described later.

In a preferred embodiment, an alloy film of Al with Ni addition is used as a metal thin film having the above characteristics. Specifically, it is an AlNi alloy film made by adding 6 wt % of Ni to Al. The AlNi alloy film is deposited at the thickness of 200 nm by sputtering using known Ar gas. The sputtering uses an alloy target of Al with Ni addition. The sputtering conditions are: DC magnetron sputtering with a deposition power density of 3 W/cm$^2$ and an Ar gas flow rate of $6.76*10^{-2}$ Pa*m$^3$/sec (=40 sccm). After that, etching is performed using a known solution at least containing phosphoric acid and nitric acid, and the photoresist pattern is removed. The gate electrode 2, the gate line 3, the auxiliary capacitor electrode 4, and the gate terminal 5 are thereby formed. In this process, the first metal thin film pattern is formed on the transparent insulating substrate 1 as shown in the column (a) of FIG. 4.

Next, the gate insulating film 6, the semiconductor film 7 and the ohmic contact film 8 are deposited sequentially by CVD process such as plasma CVD. Then, a second photolithography process is performed for patterning of the semiconductor film 7 and the ohmic contact film 8. The pattern of the semiconductor film 7 and the ohmic contact film 8 is preferably formed not only in the area of the TFT 108 as a switching device but also in the area where the gate line 3 and the source line 10 cross each other. An unevenness of the gate line 3 pattern is thereby reduced by the pattern of the semiconductor film 7 and the ohmic contact film 8, which prevents the disconnection of the source line 10 at the uneven portion. After patterning the ohmic contact film 8, it is preferred to perform plasma treatment before depositing a second metal thin film. The plasma treatment uses at least one gas selected from $N_2$, $O_2$, He and H. The surface is thereby modified to enhance the adherence with the second metal thin film, which is deposited later.

The gate insulating film 6 is made of $SiN_x$ (silicon nitride), $SiO_y$ (silicon oxide) or the like. The semiconductor film 7 is made of a-Si (amorphous silicon), p-Si (polysilicon) or the like. The ohmic contact film 8 is n-type semiconductor and is made of n$^+$a-Si (n$^+$ amorphous silicon) film, n$^+$ p-Si (n$^+$ polysilicon) film or the like, which is a-Si or p-Si doped with a minute amount of P (phosphorus) or the like.

In a preferred embodiment, a SiN film with a thickness of 400 nm as the gate insulating film 6, an a-Si film with a thickness of 150 nm as the semiconductor film 7, and an a-Si film with a thickness of 30 nm as the ohmic contact film 8 are deposited sequentially using CVD (chemical vapor deposition) process. Then, P (phosphorus) is added as impurity to the ohmic contact film 8 to change it into an n$^+$a-Si film. Then, the semiconductor film 7 and the ohmic contact film 8 are etched through the photoresist pattern by dry etching using known fluorine series gas. After that, the photoresist pattern is removed to form the pattern of the semiconductor film 7 and the ohmic contact film 8. The structure shown in the column (b) of FIG. 4 is thereby formed on the transparent insulating substrate 1.

After that, a second metal thin film, which serves as a source line material, is deposited by sputtering or the like. A third photolithography process is then performed for patterning. The source electrode 9, the source line 10, the drain electrode 11 and the source terminal 12 are thereby formed. Then, the ohmic contact film 8 is removed by etching or the like using the pattern of the source electrode 9 and the drain electrode 11 as a mask. In this process, the central part of the ohmic contact film 8 is removed to expose the semiconductor film 7. The part where the ohmic contact film 8 is removed serves as the channel portion 13. After that, the photoresist pattern is removed to thereby form the pattern of the source electrode 9, the source line 10, the drain electrode 11, the source terminal 12 and the channel portion 13 of the TFT 108.

The second metal thin film is preferably a metal thin film having low electric specific resistance and good electric contact characteristics with the ohmic contact film 8 and the pixel electrode 18 and a source terminal pad 20, which are described later. In a preferred embodiment, an alloy film of Al with Ni addition is used as a metal thin film having such characteristics. Specifically, an AlNi alloy film made by adding 6 wt % of Ni to Al is deposited at the thickness of 200 nm by sputtering using known Ar gas. The sputtering uses an alloy target of Al with Ni addition. A third photolithography process is then performed for the patterning of the photoresist into a desired shape. Further, the AlNi alloy film is etched using a known solution containing phosphoric acid and nitric acid. Further, a part of the ohmic contact film 8 in between the source electrode 9 and the drain electrode 11 is removed by dry etching using known fluorine series gas. In this process, the pattern of the channel portion 13 of the TFT 108 is formed. Then, the photoresist pattern is removed to thereby form the source electrode 9, the source line 10, the drain electrode 11, the source terminal 12 and the channel portion 13. The structure shown in the column (c) of FIG. 4 is thereby formed on the transparent insulating substrate 1.

After that, the passivation film 14, which is an insulating film made of $SiN_x$, $SiO_y$ or the like, or a mixture or lamination of those, is formed by CVD process such as plasma CVD. A fourth photolithography process is then performed for patterning.

In this process, a part of the passivation film 14 which is formed above the drain electrode 11 is removed, so that the drain electrode 11 made of the second metal thin film is exposed. The pixel contact hole 15 is thereby created. In the same process, a part of the passivation film 14 and the gate insulating film 6 which are formed above the gate terminal 5 is removed, so that the gate terminal 5 made of the first metal thin film is exposed. The gate terminal contact hole 16 is thereby created. Further, in the same process, a part of the passivation film 14 which is formed above the source terminal 12 is removed, so that the source terminal 12 made of the second metal thin film is exposed. The source terminal contact hole 17 is thereby created. These contact holes establish the conduction of the transparent conductive film, which is deposited and forms the pixel electrode 18 later, with the drain electrode 11 of the TFT 108, the gate terminal 5, and the source terminal 12.

In a preferred embodiment, a SiN film with a thickness of 300 nm is deposited as the passivation film 14 by CVD (chemical vapor deposition). Then, the gate insulating film 6 and the passivation film 14 made of SiN are etched away through the photoresist pattern by dry etching using known fluorine series gas. After that, the photoresist pattern is removed to thereby create the pixel contact hole 15, the gate terminal contact hole 16 and the source terminal contact hole 17.

The passivation film 14 is deposited at the temperature of 200° C. to 230° C. This avoids diffusion of Si elements to an Al alloy at the interface of the ohmic contact ($n^+$a-Si) film 8 with the source electrode 9 and the drain electrode 11. It is thereby possible to prevent the Si elements of the ohmic contact film 8 from being diffused to the Al alloy which forms the source electrode 9 and the drain electrode 11. This reduces the leakage current (OFF current) during the OFF state of the TFT 108. This also prevents the reduction of the TFT mobility. The deposition temperature of the passivation film 14 is set to be 200° C. or higher in order to increase the activation rate of the ohmic contact film 8 to stabilize the defect level of the back channel side. On the other hand, the deposition temperature is set to be 230° C. or lower in order to prevent the reduction of the mobility of TFT characteristics. The structure shown in the column (d) of FIG. 4 is thereby formed on the transparent insulating substrate 1.

After that, a transparent conductive film such as ITO (Indium Tin Oxide), $SnO_2$ or InZnO is deposited by sputtering, vapor deposition, coating, CVD, printing, sol-gel process or the like. The transparent conductive film may be a lamination or a mixed layer of ITO, $SnO_2$, InZnO and so on. A fifth photolithography process is then performed for patterning. In this process, the pattern of the pixel electrode 18, the gate terminal pad 19 and the source terminal pad 20 is formed.

The pixel electrode 18 is formed substantially entirely except for the TFT 108 of each pixel area. The pixel electrode 18 is electrically connected with the drain electrode 11 in the lower layer through the pixel contact hole 15. The gate terminal pad 19 is formed above the gate terminal contact hole 16. The gate terminal pad 19 is electrically connected with the gate terminal 5 in the lower layer through the gate terminal contact hole 16. The source terminal pad 20 is formed above the source terminal contact hole 17. The source terminal pad 20 is electrically connected with the source terminal 12 in the lower layer through the source terminal contact hole 17. In this manner, the transparent conductive film is conducted with the drain electrode 11, the gate terminal 5 and the source terminal 12 through the pixel contact hole 15, the gate terminal contact hole 16 and the source terminal contact hole 17, respectively.

In a preferred embodiment, an ITO film, which is a mixture of indium oxide ($In_2O_3$) and tin oxide ($SnO_2$), is deposited as a transparent conductive film at the thickness of 100 nm by sputtering using known Ar gas. A light transmissive conductive material containing at least one of indium oxide, tin oxide, and zinc oxide may be used as the transparent conductive film. Then, a photoresist pattern is formed by the fifth photolithography process. Then, etching is performed thereon using a known solution containing phosphoric acid and nitric acid. After that, the photoresist pattern is removed to thereby form the pixel electrode 18, the gate terminal pad 19 and the source terminal pad 20. The structure shown in the column (e) of FIG. 4 is produced in the above process.

A process of annealing may be added after the formation of the pixel electrode 18 in order to further stabilize the activation rate of the ohmic contact film 8. In this case, annealing is performed at the temperature of 230° C. or lower, so that the temperature of the TFT array substrate after the formation of the pixel electrode 18 does not exceed 230° C. This is because exceeding 230° C. causes the diffusion of Si elements at the interface between the ohmic contact film 8 and the source electrode 9 and the interface between the ohmic contact film 8 and the drain electrode 11. It is thereby possible to prevent the degradation of electric contact characteristics. Exceeding 230° C. also causes a decrease in the mobility of TFT characteristics, which is unfavorable.

The TFT array substrate for liquid crystal displays is manufactured in the series of process described above.

In the TFT array substrate that is produced as above, an Al alloy which contains at least Ni as an additive is formed as a single-layer film as the gate electrode 2, the gate line 3 and the gate terminal 5 that are made of the first metal thin film, which allows the reduction of gate line resistance. This further achieves good direct contact characteristics between the gate terminal 5 and the ITO film forming the gate terminal pad 19. The direct contact characteristics are resistance characteristics at a portion where conductive materials are directly in connect with each other. Because an AlNi alloy and an ITO have good direct contact characteristics, it is possible to eliminate the annealing process at the temperature of 300° C., which is performed in related arts for the purpose of reducing the contact resistance. This avoids the reduction of the mobility of the TFT 108.

Further, an Al alloy which contains at least Ni as an additive is formed as a single-layer film as the source electrode 9, the source line 10, the drain electrode 11 and the source terminal 12 that are made of the second metal thin film, which allows the reduction of source line resistance. This further achieves good direct contact characteristics between the drain electrode 11 and the ohmic contact film 8 and between the drain electrode 11 and the pixel electrode 18. This also achieves good direct contact characteristics between the source electrode 9 and the ohmic contact film 8 and between the source terminal 12 and the source terminal pad 20. Because an AlNi alloy and an ITO have good direct contact characteristics, it is possible to eliminate the annealing process at the temperature of 300° C., which is performed in related arts for the purpose of reducing the contact resistance. In this embodiment, the deposition temperature of the passivation film 14 and the annealing temperature are both 230° C. or lower. Accordingly, the temperature of the TFT array substrate after the formation of the source electrode 9 and the drain electrode 11 does not exceed 230° C. This prevents the reduction of the mobility of the TFT 108. Although the deposition temperature of the passivation film 14 and the annealing temperature are preferably 230° C. or lower, they may be 280° C. or lower.

It is thereby possible to manufacture a TFT array substrate of a liquid crystal display which is suitable for the features of a large-size display screen, high-definition and high-speed response. Further, it eliminates the need for forming a three-layer structure of MoCr/Al alloy/MoCr, which is used in related arts to improve direct contact characteristics, thereby simplifying the manufacture process.

In this embodiment, an alloy film which made of Al with 6 wt % of Ni addition is used as the first and second metal thin films. Adding Ni to Al achieves good electric contact characteristics between the second metal thin film and an n$^+$a-Si film to form the ohmic contact film 8. It also achieves good electric contact characteristics between the first and second metal thin films and the ITO film. The additive amount of Ni is not limited to 6 wt %, and the preferred range is from 1.0 wt % to 30 wt %. The addition of Ni of 1.0 wt % or higher allows the suppression of mutual diffusion of Si elements at the interface between the second metal thin film and the n$^+$a-Si film. This also allows the suppression of mutual diffusion of O elements at the interface between the first and second metal thin films and the ITO film. It is thereby possible to obtain good electric contact characteristics. On the other hand, if the additive amount of Ni exceeds 30 wt %, the electric specific resistance becomes 20 μΩcm or higher. This loses the advantage over conventional Cr (specific resistance: 20 μΩcm), Ti (specific resistance: 50 μΩcm) and Ta (specific resistance: 25 μΩcm). The specific resistance can be within the range of 3.5 to 20 μΩcm by limiting the additive amount of Ni to the range of 1.0 wt % to 30 wt %, thus achieving the low resistance lines, which are an advantage of the present invention.

Further, a rare-earth element such as Y, La or Nd may be added to the AlNi alloy. The addition of the rare-earth element allows the improvement of heat resistance. For example, it is possible to prevent the occurrence of hillock, which is projecting surface roughness, in spite of the annealing process at the temperature of 200° C. to 230° C. This improve the coverage characteristics of the gate insulating film 6 above the gate electrode 2, the gate line 3, the auxiliary capacitor electrode 4 and the gate terminal 5, and the passivation film 14 above the source electrode 9, the source line 10 and the drain electrode 11. The additive amount of the rare-earth element may be optimized so that the effect of suppressing hillock and the electric specific resistance are within a desired range.

Second Embodiment

The TFT array substrate according to a second embodiment of the present invention is used for electro-optic displays, and a liquid crystal display is described hereinbelow as an example. The top plan view and the cross-sectional view of the TFT array substrate are the same as those in the first embodiment shown in FIGS. 2 and 3. The structure of the TFT array substrate is the same as that of the first embodiment except for the material of the first and second metal thin films, and the description is not repeated herein. In this embodiment, an alloy film composed mainly of Mo or a pure Mo film is used as the first and second metal thin films. Thus, the gate electrode 2, the gate line 3, the auxiliary capacitor electrode 4, the gate terminal 5, the source electrode 9, the source line 10, the drain electrode 11 and the source terminal 12 are made of an alloy film composed mainly of Mo or a pure Mo film.

A method of manufacturing the TFT array substrate of the liquid crystal display according to this embodiment is described hereinafter with reference to FIG. 4. As described earlier, this embodiment is the same as the first embodiment except for the first and second metal thin films and thus not described in detail herein.

First, the gate electrode 2, the gate line 3, the auxiliary capacitor electrode 4, and the gate terminal 5 are formed. In a preferred embodiment, an alloy film composed mainly of Mo is used as the first metal thin film. Specifically, it is a MoNb alloy film containing Mo with 5 wt % of Nb addition. The MoNb alloy film is deposited at the thickness of 200 nm by sputtering using known Ar gas. In the sputtering, an alloy target of Mo with Nb addition is used. The sputtering conditions, the etching method and so on are the same as those in the first embodiment. The gate electrode 2, the gate line 3, the auxiliary capacitor electrode 4, and the gate terminal 5 are thereby formed. The first metal thin film may be a pure Mo film. In this process, the pattern of the first metal thin film is formed on the transparent insulating substrate 1 as shown in the column (a) of FIG. 4.

Next, the gate insulating film 6, the semiconductor film 7 and the ohmic contact film 8 are deposited sequentially by CVD process such as plasma CVD. The second photolithography process is then performed to form the pattern of the semiconductor film 7 and the ohmic contact film 8. The structure shown in the column (b) of FIG. 4 is thereby formed on the transparent insulating substrate 1.

After that, the second metal thin film, which serves as a source line material, is deposited by sputtering or the like, and the third photolithography process is performed for patterning. The source electrode 9, the source line 10, the drain electrode 11, the source terminal 12 and the channel portion 13 of the TFT 108 are thereby formed.

In a preferred embodiment, an alloy film composed mainly of Mo is used as the second metal thin film. Specifically, it is a MoNb alloy film containing Mo with 5 wt % of Nb addition. The MoNb alloy film is deposited at the thickness of 200 nm by sputtering using known Ar gas. In the sputtering, an alloy target of Mo with Nb addition is used. The patterning and etching are performed subsequently. The source electrode 9, the source line 10, the drain electrode 11, the source terminal 12 and the channel portion 13 are thereby formed. The second metal thin film may be a pure Mo film. In this process, the structure shown in the column (c) of FIG. 4 is formed on the transparent insulating substrate 1.

After that, the passivation film 14, which is an insulating film made of SiN$_x$, SiO$_y$ or the like, or a mixture or lamination or those, is formed by CVD process such as plasma CVD. The fourth photolithography process is then performed for patterning. The pixel contact hole 15, the gate terminal contact hole 16 and the source terminal contact hole 17 are thereby created.

The passivation film 14 is deposited at the temperature of 200° C. to 230° C. This avoids the diffusion of Si elements to the Mo alloy at the interface of the ohmic contact film 8 with the source electrode 9 and the interface of the ohmic contact film 8 with the drain electrode 11. This reduces the leakage current (OFF current) during the OFF state of the TFT 108. This also prevents the reduction of the TFT mobility. The deposition temperature of the passivation film 14 is set to be 200° C. or higher in order to increase the activation rate of the ohmic contact film 8 to stabilize the defect level of the back channel side. On the other hand, the deposition temperature is set to be 230° C. or lower in order to prevent the reduction of the mobility of TFT characteristics. The structure shown in the column (d) of FIG. 4 is thereby formed on the transparent insulating substrate 1.

After that, a transparent conductive film such as ITO (Indium Tin Oxide), SnO$_2$ or InZnO is deposited by sputtering, vapor deposition, coating, CVD, printing, sol-gel process or the like. In this process, the pattern of the pixel electrode 18, the gate terminal pad 19 and the source terminal pad 20 is formed. The structure shown in the column (e) of FIG. 4 is thereby produced.

The TFT array substrate for the liquid crystal display is produced in the series of process described above.

A process of annealing may be added after the formation of the pixel electrode 18 in order to further stabilize the activation rate of the ohmic contact film 8. In this case, annealing is performed at the temperature of 230° C. or lower, so that the temperature of the TFT array substrate after the formation of the pixel electrode 18 does not exceed 230° C. This is because exceeding 230° C. causes the diffusion of Si elements at the interface between the ohmic contact film 8 and the source electrode 9 and the interface between the ohmic contact film 8 and the drain electrode 11 as described above. It is thereby possible to prevent the degradation of electric contact characteristics. Exceeding 230° C. also causes a decrease in the mobility of TFT characteristics, which is unfavorable.

In the TFT array substrate that is produced as above, an alloy film which is composed mainly of Mo or a pure Mo film is formed as a single-layer film as the gate electrode 2, the gate line 3 and the gate terminal 5 that are made of the first metal thin film, which allows the reduction of gate line resistance. This further achieves good direct contact characteristics between the gate terminal 5 and the ITO film forming the gate terminal pad 19. Because an alloy film composed mainly of Mo or a pure Mo film and an ITO have good direct contact characteristics, it is possible to eliminate the annealing process at the temperature of 300° C., which is performed in related arts for the purpose of reducing the contact resistance. This avoids the reduction of the mobility of the TFT 108.

Further, an alloy film which is composed mainly of Mo or a pure Mo film is formed as a single-layer film as the source electrode 9, the source line 10, the drain electrode 11 and the source terminal 12 that are made of the second metal thin film, which allows the reduction of source line resistance. This further achieves good direct contact characteristics between the drain electrode 11 and the ohmic contact film 8 and between the drain electrode 11 and the pixel electrode 18. This also achieves good direct contact characteristics between the source electrode 9 and the ohmic contact film 8 and between the source terminal 12 and the source terminal pad 20. Because an alloy film composed mainly of Mo or a pure Mo film and an ITO have good direct contact characteristics, it is possible to eliminate the annealing process at the temperature of 300° C., which is performed in related arts for the purpose of reducing the contact resistance. In this embodiment, the deposition temperature of the passivation film 14 and the annealing temperature are both 230° C. or lower. Accordingly, the temperature of the TFT array substrate after the formation of the source electrode 9 and the drain electrode 11 does not exceed 230° C. This prevents the reduction of the mobility of the TFT 108. Although the deposition temperature of the passivation film 14 and the annealing temperature are preferably 230° C. or lower, they may be 280° C. or lower.

In this embodiment, it is preferred to use an alloy film composed mainly of Mo as the first and second metal thin films. A pure Mo film has low water resistance and low corrosion resistance because a natural oxide layer which is formed on its surface dissolves into the moist atmosphere containing water or moisture vapor. The water resistance and corrosion resistance can be significantly improved by adding Nb to form a MoNb alloy, for example. This further enhances the reliability of the TFT array substrate.

The Nb amount to be added to Mo is preferably from 2.5 wt % to 20 wt %. If the Nb amount is less than 2.5 wt %, sufficient water resistance cannot be achieved. If, on the other hand, the Nb amount is more than 20 wt %, the electric specific resistance becomes 20 μΩcm or higher. This loses the advantage over conventional Cr (specific resistance: 20 μΩcm), Ti (specific resistance: 50 μΩcm) and Ta (specific resistance: 25 μΩcm). The specific resistance can be within the range of 10 to 20 μΩcm by limiting the additive amount of Nb to the range of 2.5 wt % to 20 wt %, thus achieving the low resistance lines, which are an advantage of the present invention.

It is thereby possible to manufacture a TFT array substrate of a liquid crystal display which is suitable for the features of a large-size display screen, high-definition and high-speed response. Further, it eliminates the need for forming a three-layer structure of MoCr/Al alloy/MoCr, which is used in related arts to improve direct contact characteristics, thereby simplifying the manufacture process.

Table 1 shows the TFT characteristics and the contact resistance of TFT array substrates according to the embodiment of the present invention and according to comparative examples with different conditions. As an embodiment of the present invention, an AlNi film is used for the second metal thin film which forms the source electrode 9, the source line 10, the drain electrode 11 and the source terminal 12. The AlNi film is the same as the one described in the first embodiment. Specifically, it is an AlNi film that is made by adding 6 wt % of Ni to Al. AlNi films that are used in comparative examples 1 and 2, which are described later, are also the same as the one described in the first embodiment. The deposition temperature of SiN for forming the passivation film 14 is 200° C., and the annealing temperature is 230° C. As the comparative example 1, an AlNi film is used for the second metal thin film. The deposition temperature of the SiN film is 200° C., and the annealing temperature is 300° C. As the comparative example 2, an AlNi film is used for the second metal thin film. The deposition temperature of the SiN film is 280° C., and the annealing temperature is 230° C. As a comparative example 3, a Cr film is used for the second metal thin film. The deposition temperature of the SiN film is 200° C., and the annealing temperature is 230° C. As a comparative example 4, a Cr film is used for the second metal thin film. The deposition temperature of the SiN film is 280° C., and the annealing temperature is 300° C. Under these conditions, the ON current, the OFF current and the mobility are measured as TFT characteristics. Further, the contact resistance between the ITO film, which forms the pixel electrode 18, and the second metal thin film is measured. The comparative example 4 is a typical known structure.

Although the first embodiment uses an AlNi alloy for the first and second metal thin films and the second embodiment uses a MoNb alloy for the first and second metal thin films, the present invention is not limited thereto. For example, it is possible to use an AlNi alloy for the first metal thin film and

TABLE 1

| | second metal thin film | deposition temperature of passivation film 14 | annealing temperature | TFT characteristics | | | ITO contact resistance 30 μm□ [Ω] | |
|---|---|---|---|---|---|---|---|---|
| | | | | ON current Ion [μA] | OFF current Ioff [pA] | mobility μfe [cm²/Vs] | | |
| embodiment of present invention | AlNi | 200° C. | 230° C. | 6.97 | 0.26 | 0.413 | 1-10 | |
| comparative example 1 | AlNi | 200° C. | 300° C. | 6.09 | 1.29 | 0.333 | 1-10 | |
| comparative example 2 | AlNi | 280° C. | 230° C. | 5.52 | 0.62 | 0.344 | 1-10 | |
| comparative example 3 | Cr | 200° C. | 230° C. | 6.97 | 0.26 | 0.413 | 100-2000 | wide variation |
| comparative example 4 | Cr | 280° C. | 300° C. | 5.22 | 0.84 | 0.296 | 50-100 | |

As shown in Table 1, the ON current is low and the OFF current is high in the known typical structure. Further, the mobility is low, thus having low TFT characteristics. Furthermore, the contact resistance with the ITO film is high. On the other hand, in the embodiment of the present invention, the ON current is high and the OFF current is low. Further, it shows the highest mobility, thus having improved TFT characteristics compared with the known structure. Furthermore, the contact resistance with the ITO film is low. Accordingly, it exhibits the most suitable results in total. In particular, the mobility of the TFT characteristics increases by about 1.4 times that of the known structure. If the annealing temperature is increased from 230° C. for the annealing temperature of the embodiment of the present invention to 300° C. as in the comparative example 1, the TFT characteristics decrease while the contact resistance with the ITO film stays the same. If, on the other hand, the deposition temperature is increased from 200° C. for the deposition temperature of the embodiment of the present invention to 280° C. as in the comparative example 2, the TFT characteristics also decrease, though it is not as significant as in the comparative example 1. Further, as shown in the comparative example 3, the TFT characteristics becomes as high as those of the embodiment of the present invention even when Cr is used for the second metal thin film if the deposition temperature of the SiN film is set to 200° C. and the annealing temperature is set to 230° C. In this case, however, the contact resistance with the ITO film increases and variation is wide, thus being unstable. Thus, good characteristics cannot be achieved in total in this case. Further, the same measurement as in the embodiment of the present invention, the comparative example 1 and the comparative example 2 is performed using a pure Mo film, which is used in this embodiment, for the second metal thin film. As a result, substantially the same results as those when using the AlNi film are obtained. From these results, the totally good characteristics can be achieved when using an AlNi alloy film or a pure Mo film for the second metal thin film and setting the process temperature including the deposition temperature of the passivation film 14 and the annealing temperature from 200° C. to 230° C. as described in the first and second embodiments.

use a MoNb alloy for the second metal thin film. Alternatively, it is possible to use a MoNb alloy for the first metal thin film and use an AlNi alloy for the second metal thin film. With the use of either combination, the advantages of the present invention can be obtained equally. A MoNb alloy may be replaced with a pure Mo film, though a MoNb alloy is preferred.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of manufacturing a TFT array substrate including a thin film transistor (TFT) having an ohmic contact film and an electrode in contact with the ohmic contact film, the method comprising:
   forming the TFT;
   depositing an interlayer insulating film to cover the TFT at a temperature of 280° C. or lower;
   creating a contact hole penetrating through the interlayer insulating film to reach a surface of the electrode;
   forming a light transmissive conductive film electrically connected with the electrode through the contact hole,
   wherein the electrode is composed of a single-layer film of an Al alloy containing Ni as an additive or a single-layer film of a Mo alloy containing Nb as an additive.

2. The method of manufacturing the TFT array substrate according to claim 1, further comprising:
   performing plasma treatment on a surface of the ohmic contact film using at least one kind of gas selected from $N_2$, $O_2$, He and H after forming the ohmic contact film.

3. The method of manufacturing the TFT array substrate according to claim 1, wherein
   the electrode is made of an Al alloy containing Ni of 1.0 wt % to 30 wt % as an additive.

4. The method of manufacturing the TFT array substrate according to claim 2, wherein
   the electrode is made of an Al alloy containing Ni of 1.0 wt % to 30 wt % as an additive.

5. The method of manufacturing the TFT array substrate according to claim 1, wherein
the electrode is made of an Mo alloy containing Nb of 2.5 wt % to 20 wt % as an additive.

6. The method of manufacturing the TFT array substrate according to claim 2, wherein
the electrode is made of an Mo alloy containing Nb of 2.5 wt % to 20 wt % as an additive.

7. The method of manufacturing the TFT array substrate according to claim 1, wherein
the light transmissive conductive film contains at least one kind selected from indium oxide, tin oxide and zinc oxide having a conductivity.

8. The method of manufacturing the TFT array substrate according to claim 2, wherein
the light transmissive conductive film contains at least one kind selected from indium oxide, tin oxide and zinc oxide having a conductivity.

9. The method of manufacturing the TFT array substrate according to claim 1, further comprising:
performing annealing at a temperature of 280° C. or lower after the formation of the light transmissive conductive film.

10. The method of manufacturing the TFT array substrate according to claim 2, further comprising:
performing annealing at a temperature of 280° C. or lower after the formation of the light transmissive conductive film.

11. The method of manufacturing the TFT array substrate according to claim 9, wherein the annealing is performed at a temperature of 230° C. or lower.

12. The method of manufacturing the TFT array substrate according to claim 10, wherein the annealing is performed at a temperature of 230° C. or lower.

13. The method of manufacturing the TFT array substrate according to claim 1, wherein the interlayer insulating film is deposited at a temperature of 230° C. or lower.

14. The method of manufacturing the TFT array substrate according to claim 9, wherein the interlayer insulating film is deposited at a temperature of 230° C. or lower.

15. The method of manufacturing the TFT array substrate according to claim 10, wherein the interlayer insulating film is deposited at a temperature of 230° C. or lower.

16. The method of manufacturing the TFT array substrate according to claim 11, wherein the interlayer insulating film is deposited at a temperature of 230° C. or lower.

17. The method of manufacturing the TFT array substrate according to claim 12, wherein the interlayer insulating film is deposited at a temperature of 230° C. or lower.

* * * * *